United States Patent [19]
Vig et al.

[11] Patent Number: 5,428,315
[45] Date of Patent: Jun. 27, 1995

[54] METHOD OF MAKING RADIATION HARDENED QUARTZ CRYSTAL OSCILLATORS

[75] Inventors: John R. Vig, Colts Neck; Arthur Ballato, Long Branch, both of N.J.

[73] Assignee: The United States of America as represented by the Secreatry of the Army, Washington, D.C.

[21] Appl. No.: 719,922

[22] Filed: Jan. 22, 1985

[51] Int. Cl.⁶ .......................... G04C 3/00; H03B 5/04; H03B 5/32
[52] U.S. Cl. ..................................... 331/175; 331/162
[58] Field of Search .................. 331/2, 16, 47, 162, 331/175, 176; 310/315; 332/26

[56] References Cited

U.S. PATENT DOCUMENTS

| | | | |
|---|---|---|---|
| 4,325,036 | 4/1982 | Kuwabara | 331/162 |
| 4,344,046 | 8/1982 | Zumsteg | 331/175 |
| 4,358,839 | 11/1982 | Wittke | 331/162 |
| 4,570,132 | 2/1986 | Driscoll | 331/162 |

FOREIGN PATENT DOCUMENTS

| | | | |
|---|---|---|---|
| 2363945 | 7/1974 | Germany | 331/162 |
| 2004155 | 3/1979 | United Kingdom | 331/162 |

OTHER PUBLICATIONS

Pellegrini et al, "Steady-State and Transient Radiation . . . ", Dec. 1978, IBR Trans. Nucl. Sci, vol. NS-25, #6 pp. 1267–1273, abst.

Gualtieri et al, "Sweeping and Irradiation . . . ", Jun. 1984, Proc. 38th Ann. Freq. Control Symp. pp. 42–49, abst.

Brunner, J., "Wide Range Temperature Compensation . . . ", Jul. 10, 1975, Elect. Lett., vol. 11, #14.

Ballato et al, "Ovenless Activity Dip Tester . . . ", 31st Ann. Freq. Cantr. Symp., Mar. 3, 1977, pp. 102–107, abst.

*Primary Examiner*—Nelson Moskowitz
*Attorney, Agent, or Firm*—Michael Zelenka; Roy E. Gordon

[57] ABSTRACT

A method is provided of making radiation compensated quartz crystal oscillators. According to the method, at least two quartz crystal oscillators are first selected that have different responses to energetic radiation from gamma rays, neutrons, etc. Each oscillator is characterized individually as to its radiation sensitivity, the oscillators then exposed to the same radiation flux and the respective output frequency extracted from each oscillator. The frequency difference between the oscillators arising from the influence of the radiation flux is then derived. A correction signal is then derived from the frequency difference and the known radiation sensitivities. The correction signal is then applied to one of the oscillators to effect radiation compensation of its frequency.

13 Claims, 1 Drawing Sheet

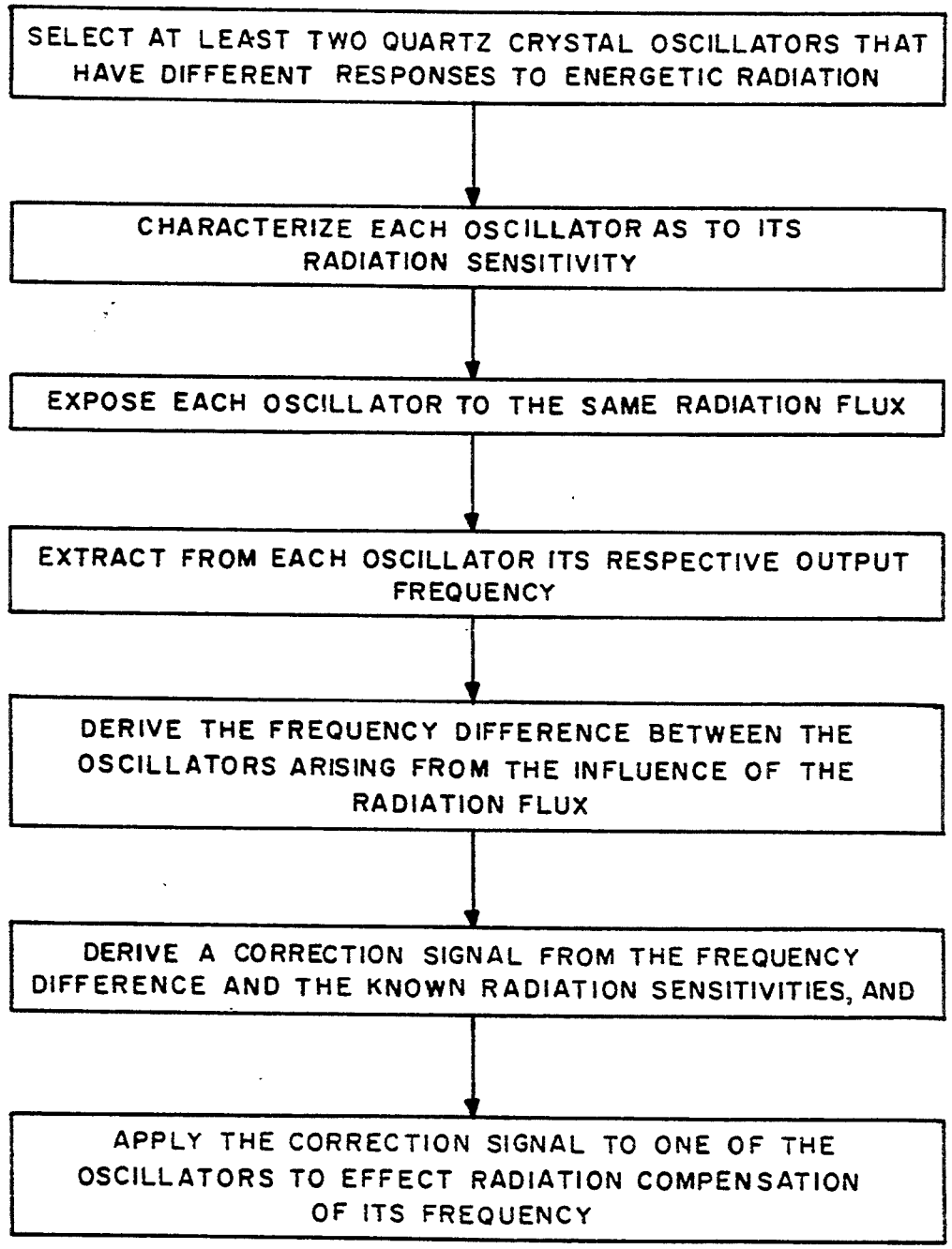

METHOD OF MAKING RADIATION HARDENED QUARTZ CRYSTAL OSCILLATORS

The invention described herein may be manufactured, used and licensed by or for the Government for governmental purposes without the payment to us of any royalty thereon.

This invention relates in general to a method of treating quartz crystal oscillators and in particular, to a method of making radiation compensated quartz crystal oscillators.

BACKGROUND OF THE INVENTION

Upon irradiating a state of the art radiation hardened quartz crystal oscillator, the frequency shifts range from parts in $10^{11}$ per rad at low dose levels (1 to 10 rads) to parts in $10^{14}$ per rad at dose levels above $10^5$ rads. Upon irradiating quartz crystal oscillators with energetic neutrons, the frequency shifts range from 1 to $7 \times 10^{-21}$ per neutron per $cm^2$. Heretofore, these radiation induced frequency shifts were thought to be an inherent, unavoidable property of quartz crystal oscillators. The radiation induced frequency shifts have limited the usefullness of quartz oscillators in radiation environments, such as in certain space applications.

SUMMARY OF THE INVENTION

The general object of this invention is to provide a method of making radiation compensated quartz crystal oscillators. Another object of the invention is to provide such a method in which radiation induced frequency shifts are avoided or minimized. A still further object of the invention is to provide such a method that enhances the usefullness of quartz oscillators in radiation environments, such as in certain space applications.

It has now been found that the aforementioned objects can be attained using at least two quartz oscillators that are selected to have different responses to energetic radiation from neutrons, gamma rays, etc. More particularly, according to the invention, at least two quartz oscillators are selected that have different responses to energetic radiation. Each oscillator is then characterized individually as to its radiation sensitivity. The oscillators are then exposed to the same radiation flux, the respective output frequency then extracted from each oscillator, and the frequency difference between the oscillators arising from the influence of the radiation flux then derived. A correction signal is then derived using the frequency difference with the known radiation sensitivities and the correction signal applied to one of the oscillators to effect radiation compensation of its frequency.

For example, when two oscillators, A and B, are used, A can be selected to produce a small radiation induced frequency shift, and B can be selected to produce a large radiation induced frequency shift. After careful characterization of the radiation responses of the two oscillators, the radiation induced frequency difference between A and B can be used to compensate for the radiation induced frequency shift of A.

One embodiment of the invention is to use oscillators that employ resonators of different cuts, e.g. an AT-cut and a BT-cut, or BT-cut and SC-cut, or a conventional AT-cut and rectangular AT-cut, or an SC-cut and a GT-cut, etc.

Another embodiment is to make use of the DC voltage dependence of radiation induced frequency shifts. For example, a pair of oscillators, A and B, with similar SC-cut resonators can be used. Oscillator A applies no DC voltage to the resonator, oscillator B applies a DC voltage. Oscillator B therefore experiences a larger radiation induced frequency shift then oscillator A. After careful characterization of the radiation responses of oscillators A and B, the radiation induced frequency difference between A and B can again be used to compensate for the radiation induced frequency shift of A.

Another embodiment of the invention uses two resonators of different capacitance ratios (or two modes of the same resonator with different capacitance ratios) together with oscillator circuits that contain radiation sensitive load capacitors. For example, oscillator A can use a fundamental mode 5 MHz SC-cut resonator and oscillator B a 5 MHz fifth overtone SC-cut resonator. Both oscillator circuits contain similar load capacitors that change capacitance value by about the same percentage in response to ionizing radiation. The radiation induced frequency shift of oscillator A will then be much larger than the radiation induced frequency shift of oscillator B. The radiation induced difference frequency between A and B can then be used to compensate for the radiation induced frequency shift of oscillator B. As a variation of this embodiment, oscillator A can contain a radiation sensitive load capacitor, and oscillator B can contain a radiation insensitive load capacitor.

For improved compensation, (possibly for even different types of radiation, e.g. $\gamma$-rays and neutrons) more than two oscillators can be used. For example, in the case of three SC-cut oscillators, A, B and C, A applies no DC voltage to the resonator, B applies 10 V, and C applies 20 V. The radiation induced difference in frequencies between A and B and between A and C can then be used to compensate for the radiation induced frequency shift of A. In general, for n types of radiation, n+1 oscillators will be used. These oscillators will have their output frequencies differenced in pairs, there being n such differences. The n frequency differences then consitute n correction signals to be applied to the most stable oscillator, one correction signal for each type of radiation.

DESCRIPTION OF THE DRAWING

The drawing represents a flow sheet of the invention.

DESCRIPTION OF THE PREFERRED EMBODIMENT

Two quartz crystal oscillators, 0-1 and 0-2 are contained in a satellite in space. 0-1 and 0-2 are so positioned as to be in the same radiation flux environment. Oscillator 0-1 has a mean radiation sensitivity of $2 \times 10^{-11}$ per rad and oscillator 0-2 has a mean radiation sensitivity of $4 \times 10^{-13}$ per rad at a radiation dose of 500 rads.

An incident flux of 500 rads is intercepted by each oscillator. The fractional frequency shift $\Delta f/f$ of oscillator 0-1 is 500 times $2 \times 10^{-11}$ or $10^{-8}$; the corresponding figure for oscillator 0-2 is 500 times $4 \times 10^{-13}$ or $2 \times 10^{-10}$. If the nominal frequency of each oscillator prior to radiation is 5 MHz, then the frequency shift of 0-1 is $5 \times 10^{+6} \times 10^{-8}$ or $5 \times 10^{-2}$ Hz; the corresponding value for 0-2 is $10^{-3}$ Hz. The frequency difference is $49 \times 10^{-3}$ Hz. This value ($49 \times 10^{-3}$) is used to derive the correction signal that is applied by art established techniques to oscillator 0-2 to bring it back to its original paradiation frequency.

Another means of compensation is to use two resonators of different frequency vs. temperature characteristics; e.g. one which has a flat f vs. T slope at the inflection temperature, $T_i$, and the other which has a turnover temperature that is far from $T_i$. The second resonator will then exhibit a larger frequency shift than the first if both are initially set to where the f vs. T has zero slope.

By selecting an appropriate oven set point away from the initial turnover temperature, it is possible to achieve at least some compensation (in a single resonator) for the neutron induced frequency shift; i.e., by selecting the set point in such a manner that the effect of rotation of the f vs. T curve offsets the absolute f vs. T shift.

For example, the neutron-irradiation induced rotation of the f vs. T curve produces an apparent decrease in the angle of cut of AT-cut resonators. Therefore, the positive absolute frequency shift due to neutron irradiation is compensated, at least partially, by selecting the oven set point to be below the inflection temperature so that the f vs. T rotation lowers the frequency. The lower the set point temperature, the larger the compensation. It is possible that complete compensation can occur for a given dose at some low temperature. For example, for an AT-cut resonator, at a neutron dose of $1.2 \times 10^{18}$ n/cm², the frequency at $T_i$ increases 880 ppm. The f vs. T curve rotation is equivalent to an angle decrease of 13 minutes. Therefore the neutron induced frequency shift decreases from 880 ppm at 30 C., to 840 ppm at 0 C., to about 814 ppm at −20 C. The temperature at which complete compensation occurs is calculable from the following expression:

$$\frac{\Delta f}{f} = 0 = k_n N - [(a - a')(T - T_i) + (b - b')(T - T_i)^2 + (c - c')(T - T_i)^3 + \ldots]$$

Where $k_n$ = the coefficient of neutron induced frequency shift, typically 1 to $7 \times 10^{-21}$/n/cm²; N is the neutron dose in n/cm²; a, b, c are the temperature coefficients before neutron irradiation; a', b', c' are the temperature coefficients after irradiation; and $T_i$ is the inflection temperature prior to irradiation.

We wish it to be understood that we do not desire to be limited to the exact details as described for obvious modifications will occur to a person skilled in the art.

What is claimed is:

1. Method of making gamma ray and neutron radiation compensated quartz crystal oscillators, said method including the steps of:

(a) selecting at least two quartz crystal oscillators that have different responses to gamma ray and neutron energetic radiation, (b) characterizing each oscillator individually as to its gamma ray and neutron radiation sensitivity, (c) exposing each oscillator to the same gamma ray and neutron radiation flux, (d) extracting from each oscillator its respective output frequency, (e) deriving the frequency difference between the oscillators arising from the gamma ray and neutron influence of the radiation flux, (f) deriving a correction signal from the frequency difference and the known radiation sensitivities, and (g) applying the correction signal to one of the oscillators to effect gamma ray and neutron radiation compensation of its frequency.

2. Method according to claim 1 wherein the oscillators use resonators having different crystal cuts.

3. Method according to claim 2 wherein the crystal cuts are an AT-cut and a BT-cut.

4. Method according to claim 2 wherein the crystal cuts are a BT-cut and an SC-cut.

5. Method according to claim 2 wherein the crystal cuts are a conventional AT-cut and a rectangular AT-cut.

6. Method according to claim 2 wherein the crystal cuts are an SC-cut and a GF-cut.

7. Method according to claim 1 where the quartz crystals of the oscillators are provided with differing DC voltage biases to make use of the DC voltage dependence of radiation induced frequency shifts.

8. Method according to claim 1 wherein the oscillators use resonators of different capacitance ratios together with oscillator circuits that contain radiation sensitive load capacitors.

9. Method according to claim 8 wherein use is made of 2 modes of the same resonator with differing capacitance ratios.

10. Method according to claim 9 wherein one oscillator uses a fundamental mode 5 MHz SC-cut resonator and another oscillator uses a 5 MHz fifth overtone SC-cut resonator.

11. Method according to claim 1 wherein compensation is made against more than one type of radiation.

12. Method according to claim 1 wherein use is made of two resonators of different frequency vs temperature characteristics.

13. Method according to claim 12 wherein one resonator has a flat f vs T slope at the inflection temperature, $T_i$, and the other resonator has a turnover temperature that is far from $T_i$.

* * * * *